(12) United States Patent
Martin

(10) Patent No.: US 9,066,421 B1
(45) Date of Patent: Jun. 23, 2015

(54) HOLDING APPARATUS FOR RETAINING A GENERALLY FLAT-SHAPED ITEM, SUCH AS A HAND-HELD ELECTRONIC DEVICE

(71) Applicant: Rex Eric Martin, Davenport, FL (US)

(72) Inventor: Rex Eric Martin, Davenport, FL (US)

( * ) Notice: Subject to any disclaimer, the term of this patent is extended or adjusted under 35 U.S.C. 154(b) by 0 days.

(21) Appl. No.: 14/098,665

(22) Filed: Dec. 6, 2013

Related U.S. Application Data

(63) Continuation-in-part of application No. 13/292,859, filed on Nov. 9, 2011, now Pat. No. 8,620,152.

(51) Int. Cl.
| | |
|---|---|
| *G03B 17/12* | (2006.01) |
| *H05K 5/02* | (2006.01) |
| *G02B 7/00* | (2006.01) |
| *G03B 17/56* | (2006.01) |
| *G02B 6/44* | (2006.01) |
| *G03B 11/04* | (2006.01) |
| *G03B 1/00* | (2006.01) |
| *G03B 17/06* | (2006.01) |
| *G03B 7/00* | (2014.01) |
| *G03B 31/00* | (2006.01) |
| *G03B 11/00* | (2006.01) |

(52) U.S. Cl.
CPC ............... *H05K 5/0217* (2013.01); *G02B 7/00* (2013.01); *G03B 17/56* (2013.01); *G02B 6/4452* (2013.01); *G03B 11/04* (2013.01); *G03B 17/12* (2013.01); *G03B 1/00* (2013.01); *G03B 17/06* (2013.01); *G03B 2206/00* (2013.01); *G03B 7/00* (2013.01); *G03B 31/00* (2013.01); *G03B 11/00* (2013.01); *G03B 2205/00* (2013.01)

(58) Field of Classification Search
USPC ........................................ 248/187.1; 396/544
See application file for complete search history.

(56) References Cited

U.S. PATENT DOCUMENTS

| | | | |
|---|---|---|---|
| 2,279,443 | A * | 4/1942 | Chanosky ..................... 396/329 |
| 2,732,751 | A | 1/1956 | Heidecke et al. |
| 3,133,719 | A | 5/1964 | Beck |
| 4,739,801 | A | 4/1988 | Kimura et al. |
| 4,836,668 | A | 6/1989 | Christianson |
| 4,856,822 | A | 8/1989 | Parker |
| 4,893,143 | A | 1/1990 | Sheng-Huei |
| D307,286 | S * | 4/1990 | Ginder ......................... D16/242 |
| 5,033,528 | A | 7/1991 | Volcani |
| D321,062 | S | 10/1991 | Bonbright |
| 5,299,067 | A | 3/1994 | Kutz et al. |

(Continued)

OTHER PUBLICATIONS

Lockwood Products, http://www.loc-line.com; Lake Oswego, OR; Oct. 23, 1999.

*Primary Examiner* — Clayton E Laballe
*Assistant Examiner* — Kevin Butler
(74) *Attorney, Agent, or Firm* — H. John Rizvi; Gold & Rizvi P.A.

(57) ABSTRACT

A holding apparatus capable of embracing a generally flat-shaped item, such as a smartphone, computer tablet or the like, said holding apparatus comprising one or more pairs of opposing V-shaped clamping surfaces capable of providing a self-adjusting, permanent grip of the sides of the item regardless of the item being static, vibrating, or touched by a user's finger or other external object. The V-shaped clamping surfaces can be arranged on two or more sides of the device. For instance, opposing V-shaped clamping surfaces can be arranged to clamp the left and right sides of a four-sided quadrangular device, and additional opposing surfaces can be arranged perpendicularly to grip the top and bottom sides of the device, providing a very effective and robust grip that minimizes the risk of the item being dropped and damaged.

14 Claims, 6 Drawing Sheets

(56) References Cited

U.S. PATENT DOCUMENTS

| | | |
|---|---|---|
| 5,449,206 A | 9/1995 | Lockwood |
| D376,380 S | 12/1996 | Yang et al. |
| 5,835,289 A | 11/1998 | Berry |
| 6,042,155 A | 3/2000 | Lockwood |
| 6,352,227 B1 | 3/2002 | Hathaway |
| 6,889,006 B2 | 5/2005 | Kobayashi |
| D508,063 S | 8/2005 | Yip et al. |
| 7,390,130 B2 * | 6/2008 | Soulvie .................. 396/419 |
| 7,533,906 B2 | 5/2009 | Luettgen et al. |
| 7,665,698 B2 | 2/2010 | Desoboro et al. |
| 7,780,126 B2 * | 8/2010 | Law et al. ............... 248/168 |
| 7,871,205 B2 * | 1/2011 | Inoue ..................... 396/422 |
| 8,197,149 B2 | 6/2012 | Darrow |
| 8,328,440 B2 * | 12/2012 | Piltz ....................... 396/428 |
| D677,309 S * | 3/2013 | Asano ..................... D16/243 |
| 8,388,243 B1 * | 3/2013 | Smith ..................... 396/422 |
| 8,509,612 B1 * | 8/2013 | PeQueen ................. 396/544 |
| 8,534,933 B2 * | 9/2013 | Sherwood ............... 396/428 |
| 8,620,152 B1 * | 12/2013 | Martin .................... 396/544 |
| D701,261 S * | 3/2014 | Burton .................... D16/242 |
| D707,748 S * | 6/2014 | Hernandez .............. D16/243 |
| 8,746,993 B2 * | 6/2014 | Sherwood ............... 396/428 |
| 2005/0099526 A1 | 5/2005 | Wu et al. |
| 2007/0081817 A1 * | 4/2007 | Soulvie ................... 396/419 |
| 2008/0240705 A1 * | 10/2008 | Nazarian ................. 396/420 |
| 2008/0251662 A1 | 10/2008 | Desoboro et al. |
| 2008/0267613 A1 | 10/2008 | Darrow |
| 2010/0007856 A1 | 1/2010 | Fujisaki et al. |
| 2010/0252696 A1 | 10/2010 | Sage |
| 2010/0314508 A1 | 12/2010 | Bevirt et al. |
| 2011/0038064 A1 | 2/2011 | Xhunga |
| 2012/0106944 A1 * | 5/2012 | Johnson .................. 396/428 |
| 2012/0288269 A1 | 11/2012 | Jensen |
| 2013/0175413 A1 * | 7/2013 | Waugh .................... 248/124.1 |
| 2013/0330069 A1 * | 12/2013 | PeQueen ................. 396/544 |

\* cited by examiner

HOLDING APPARATUS FOR RETAINING A GENERALLY FLAT-SHAPED ITEM, SUCH AS A HAND-HELD ELECTRONIC DEVICE

CROSS-REFERENCE TO RELATED APPLICATION

This Continuation-In-Part Utility Patent application claims the benefit of co-pending United States Non-Provisional patent application Ser. No. 13/292,859, filed on Nov. 9, 2011, which is incorporated herein in its entirety.

FIELD OF THE INVENTION

The present disclosure relates to a holding apparatus for retaining a generally flat-shaped item, and in particular, a generally flat-shaped, hand-held electronic device such as smartphone, camera, media player, tablet or the like, in order to protect the device and/or to provide the device with additional external functionality.

BACKGROUND OF THE INVENTION

Hand-held electronic devices such as smartphones, tablets, cameras, media players, and the like quite frequently require the connection of external holding accessories that at least partially embrace the device. For instance, a holding accessory including a camera lens can be attached to camera, tablet or smartphone devices in order to provide the devices with enhanced photographic capabilities. Similarly, holding accessories providing an interface for connecting a tripod and other mounting brackets are also known in the art. In a further example, a holding accessory can be used to mount the electronic device onto a vehicle dashboard or windshield so that it is correctly placed for the vehicle occupants to use a navigation software application run by the device. In another example, covers or cases can be installed on the devices to make them waterproof and be able to be used for capturing underwater pictures or videos. It is also common to simply provide the hand-held devices with a protective cover, in order to reduce the risk of the devices becoming deteriorated due to regular use. Occasionally, covers can comprise additional functionality such as an integrated keyboard, card holders, etc.

Hand-held electronic device holding apparatus or covers are available in a wide variety of designs. For instance, holding apparatus or covers can be shaped and sized to perfectly match the device model, or, alternatively, be adjustable so that they can be fitted onto different devices. Normally, model-specific holding apparatus provide a better aesthetic finish, while presenting the drawback that they cannot be re-used from one device model to another, forcing the user to purchase different covers or holding apparatus for each device. Adjustable holding apparatus or covers are usually less attractive, but can be shared among different devices and thus be a more cost effective solution when owning several hand-held electronic devices. In addition, adjustable holding apparatus or covers are the only option to be used with devices that do not have specific matching covers of their own.

Adjustability of holding apparatus is usually achieved by using elastic materials or elements capable of biasing the apparatus so that it adjustably fits onto the electronic device. For example, the holding apparatus can be manufactured of a rubberized material capable of elastically wrapping around electronic devices of different sizes. In another example, the holding apparatus can comprise movable parts capable of being elastically pushed against the electronic device by a spring or other elastic element comprised in the holding apparatus. Having the holding apparatus fit elastically onto the electronic device presents several disadvantages. For example, the final position of the electronic device is not mechanically locked and the electronic device can wobble and eventually fall off of the holding apparatus, especially in the event that the holding apparatus and the electronic device are being used in a vibrating setting (e.g. a vehicle in motion) or in the event that an external object inadvertently comes into contact with the electronic device. In addition, the elastic properties of the spring or other elastic element are normally diminished by excessive use of the holding apparatus or simply by time passing. Because of this, adjustable holding apparatus eventually tend to become loose, thus increasing the risk of the device being dropped and damaged.

Thus, there remains a need in the art for a holding apparatus that is adjustable to fit onto electronic devices of different sizes, and yet provides a stable, firm and durable grip that minimizes the risk of the electronic device being dropped and damaged. The holding apparatus should also preferably be relatively simple from a constructive point of view, and be able to be quickly and easily mounted and dismounted from the electronic device.

SUMMARY OF THE INVENTION

The present invention of a holding apparatus for retaining a generally flat-shaped item such as an electronic device overcomes the deficiencies of the known art and the problems that remain unsolved by providing a holding mechanism based on opposing clamping V-shaped surfaces that very stably clamp the generally flat-shaped item.

In accordance with one embodiment of the present invention, the invention consists of a holding apparatus for retaining a generally flat-shaped item by at least partially embracing the item, said holding apparatus comprising:
  a first clamping member and a second clamping member, movably spaced apart for clamping and unclamping a generally flat-shaped item placed in between; wherein
  said first and second clamping members include respective V-shaped grooves in opposing orientation for clamping the item, so that the item automatically rests on both angled surfaces of the V-shaped groove on each clamping member, and is thus always stably gripped by the clamping members.

In a second aspect, the holding apparatus further comprises a retention member for fixing the relative position of the first and second clamping members.

In another aspect, the holding apparatus comprises a base member having a first end, a second end, a top surface, an opposing bottom surface and an elongate slot formed through said top surface and said bottom surface and positioned adjacent said first end, wherein the first clamping member is slidably coupled adjacent to said first end and along said top surface of said base member by the retention member, said retention member having a threaded protrusion configured to pass through said elongate slot and engage in a corresponding threaded aperture formed into said first clamping member; and wherein the second clamping member is coupled adjacent to said second end of said base member and along said top surface of said base member.

In another aspect, the first clamping member is slidably fitted between side walls protruding from the base member.

In another aspect, the first clamping member comprises protruding side walls arranged perpendicularly to the base member.

In another aspect, the second clamping member comprises protruding side walls arranged perpendicularly to the base member.

In another aspect, the first and second clamping members comprise side walls arranged perpendicularly to the base member, the holding apparatus thus being capable of embracing at least three sides of a four-sided item.

In another aspect, the V-shaped grooves are arranged along part of the length of the side walls of the first and second clamping members.

In another aspect, the V-shaped grooves are arranged along the entire length of the side walls of the first and second clamping members.

In another aspect, the holding apparatus further comprises an additional base member arranged in opposition to the first base member, so that the holding apparatus is capable of embracing all four sides of a four-sided item.

In another aspect, the additional base member is coupled to a third clamping member, and is slidably coupled to a fourth clamping member, said third and fourth clamping members having a V-shaped groove in opposing orientation for clamping the generally flat-shaped item, so that the item automatically rests on both angled surfaces of the V-shape groove on each clamping member, and is thus always stably gripped by the third and fourth clamping members.

In another aspect, the fourth clamping member is slidably coupled to the second clamping member, and the third clamping member is slidably coupled to the first clamping member, thus allowing for bi-dimensional adjustment of the holding apparatus onto the item.

In another aspect, the holding apparatus further comprises opposing V-shaped grooves parallel to the base members, so that the holding apparatus is capable of clamping all four sides of a four-sided item by means of V-shaped grooves.

In accordance with another embodiment of the invention, the invention consists of a holding apparatus for retaining a generally flat-shaped, four-sided item by at least partially embracing the item, said holding apparatus comprising:
  a frame for embracing a generally flat-shaped, four sided item, said frame providing at least a first pair of opposing V-shaped clamping surfaces and a second pair of opposing V-shaped clamping surfaces, said second pair being perpendicular to the first pair so that said at least four opposing V-shaped clamping surfaces provide four-side clamping of a generally flat-shaped, four-sided item arranged inside the frame.

In a second aspect, the frame is quadrangular in shape and formed by four length-adjustable side portions.

In accordance with yet another embodiment of the invention, the invention consists of a holding apparatus for retaining a generally flat-shaped item by at least partially embracing the item, said holding apparatus comprising at least two opposing clamping V-shaped surfaces, spaced apart for clamping at least two side areas of generally flat-shaped item arranged in between the V-shaped surfaces.

In a second aspect, the relative position between the V-shaped surfaces is adjustable.

In another aspect, a V-shaped surface is integrally formed in a part of the holding apparatus.

In another aspect, a V-shaped surface is created when assembling different parts of the apparatus.

These and other aspects, features, and advantages of the present invention will become more readily apparent from the attached drawings and the detailed description of the preferred embodiments, which follow.

BRIEF DESCRIPTION OF THE DRAWINGS

The components in the figures are not necessarily to scale, emphasis instead being placed upon illustrating the principles of the invention. The invention will now be described, by way of example and without limitation, with reference to the accompanying drawings, in which.

In the figures, like reference numerals designate corresponding elements throughout the different views of the drawings.

DETAILED DESCRIPTION OF THE PREFERRED EMBODIMENTS

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. In other implementations, well-known features and methods have not been described in detail so as not to obscure the invention. For purposes of description herein, the terms "upper", "lower", "left", "right", "front", "back", "vertical", "horizontal", and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments that may be disclosed herein are not to be considered as limiting, unless the claims expressly state otherwise.

Figure 1:
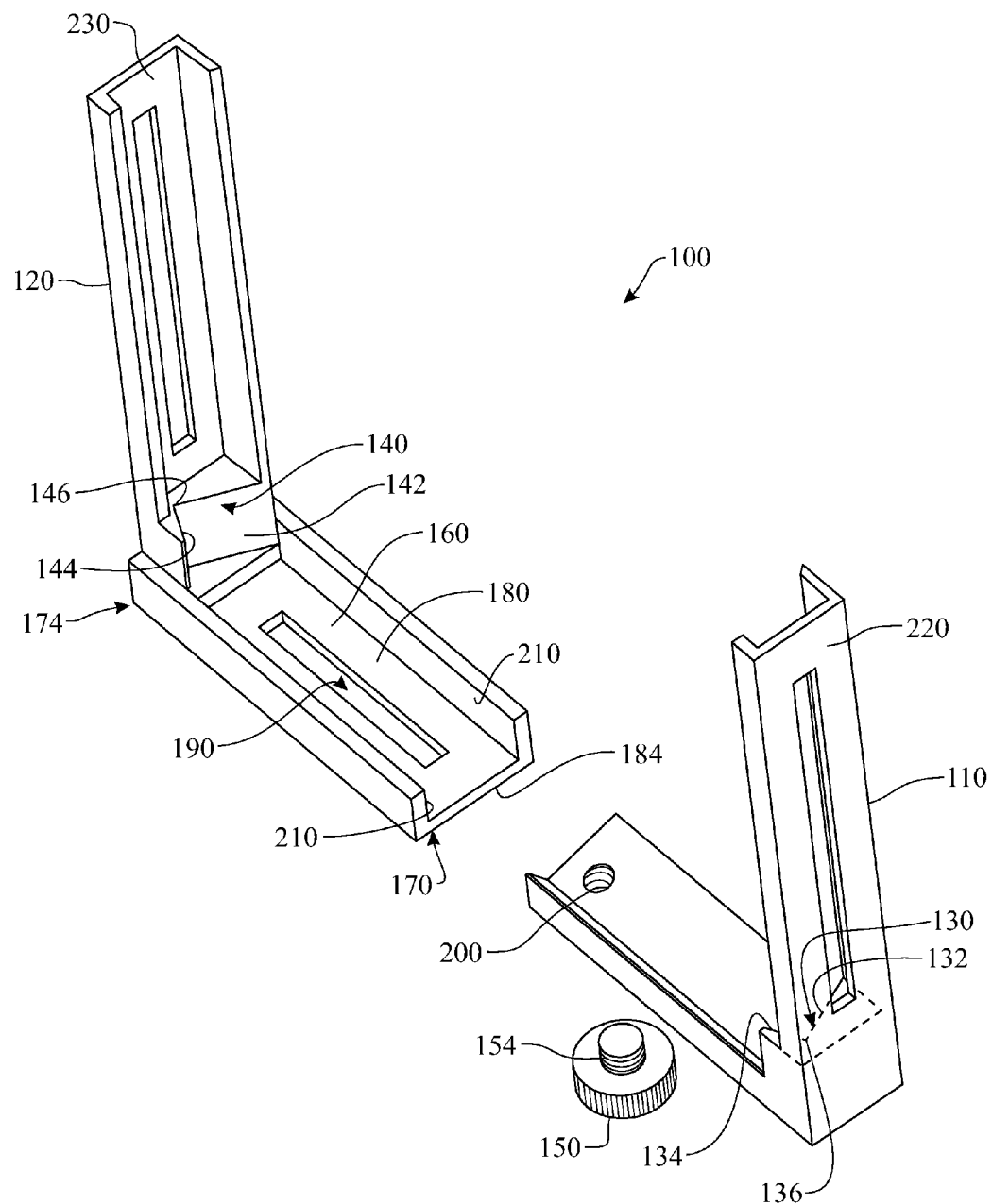
FIG. 1 presents a perspective exploded view of an exemplary embodiment of a holding apparatus in accordance with the present invention.

The illustration of FIG. 1 presents a perspective exploded view of an exemplary embodiment of a holding apparatus in accordance with the present invention. The holding apparatus 100 includes a first clamping member 110 and a second clamping member 120, movably spaced apart for clamping and unclamping a generally flat-shaped item placed in between, not shown in the figure. As can be observed, the first and second clamping members 110, 120 include respective V-shaped grooves 130, 140 or, in other words, inward V-shaped surfaces, where the V-shaped grooves 130, 140 are arranged in opposing orientation for clamping the item. Each V-shaped groove 130, 140 comprises two angled surfaces 132, 134, 142, 144 meeting at intersecting edge 136, 146.

In the present embodiment, the first and second clamping members 110, 120 are movably spaced apart by having their lower positions—in the position of FIG. 1-*slidable* relative to one another. Alternative embodiments are however contemplated for having the first and second clamping members movable relative to one another so to be able to vary the distance between the V-shaped grooves.

Figure 2:
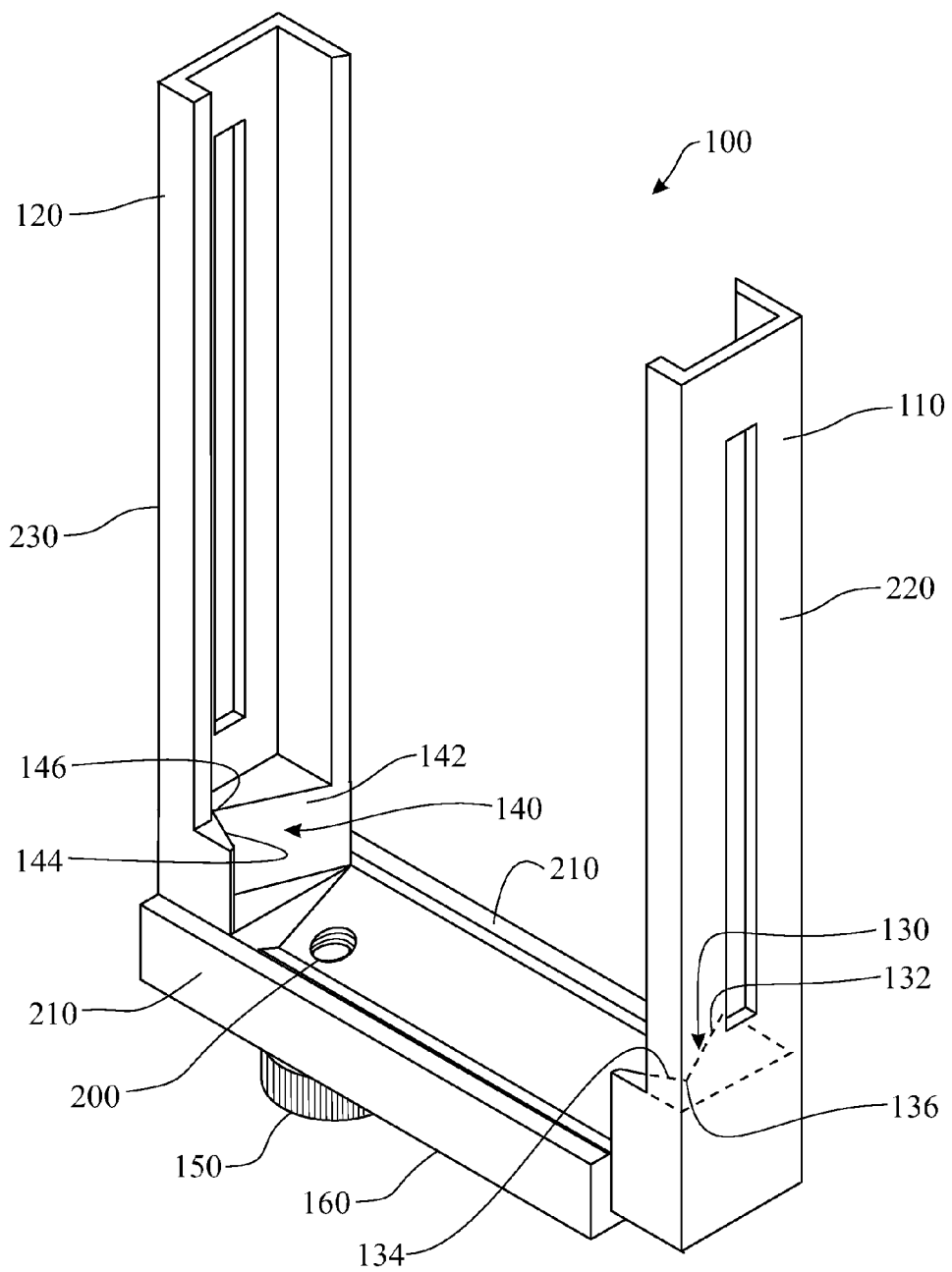
FIG. 2 presents a perspective view of the holding apparatus of FIG. 1, shown assembled.

The illustration of FIG. 2 shows the first and second clamping members 110, 120 having been assembled so that the first clamping member 110 has slidden into the second clamping member 120. The holding apparatus 100 of the present embodiment has acquired a U-shape arrangement inside which a generally flat-shaped item can be clamped by the V-shaped grooves 130, 140 on the sides of the U. The illustration of FIG. 3, for instance, shows a smartphone 500 being held inside the holding apparatus 100, by having the side V-shaped grooves 130, 140 clamp the sides of the smartphone 500. Having the smartphone 500 embraced by two V-shaped grooves 130, 140 means that the sides of the smartphone rest on the angled surfaces 132, 134, 142, 144 of the V-shaped grooves 130, 140. In the event that the smartphone 500 shifts or vibrates, causing the sides of the smartphone to slightly move with respect to the holding apparatus 100, the sides of the smartphone 500 will simply slightly move along the angled surfaces 132, 134, 142, 144 maintaining their contact with the angled surfaces, and the smartphone 500 thus automatically continues to rest on both angled surfaces 132, 134, 142, 144 of each V-shaped groove 130, 140. Therefore, having a V-shaped clamp allows for permanent optimum clamping of the smartphone 500, regardless of it moving due to vibration or contact with an external object (such as a finger touching the phone screen). The smartphone 500 is securely gripped and prevented from falling.

Figure 3:
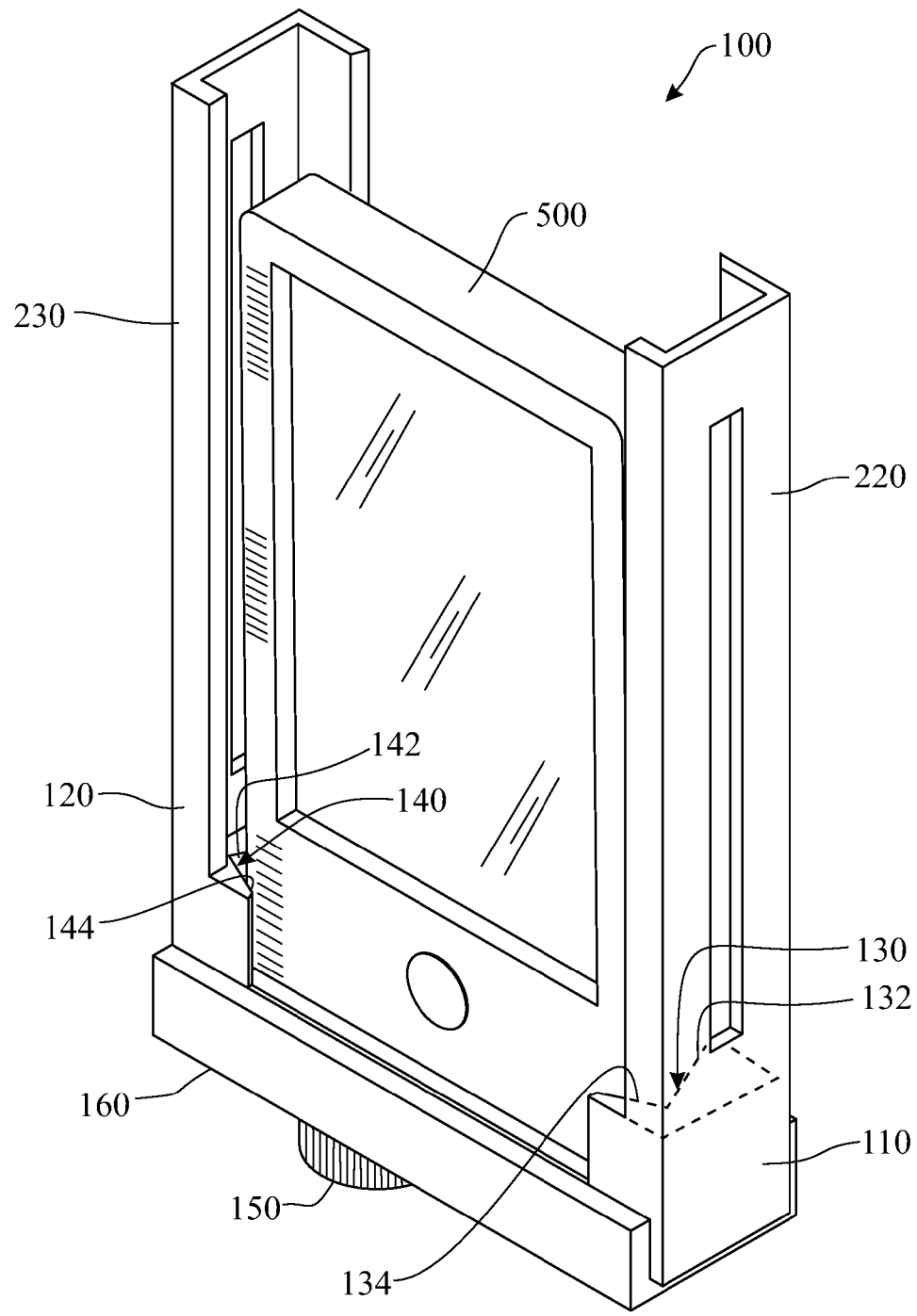
FIG. 3 presents a further perspective view of the holding apparatus of FIG. 1, shown while being used for holding a smartphone device.

As shown in FIGS. 1 through 3, the holding apparatus 100 can comprise a retention member 150 for fixing the relative position of the first and second clamping members 110, 120. Being able to fix the relative position of the first and second clamping members 110, 120 by a retention member 150 provides a tight and durable gripping of the smartphone 500.

As shown especially in FIGS. 1 and 2, the holding apparatus 100 of the present embodiment comprises a base member 160 having a first end 170, a second end 174, a top surface 180, an opposing bottom surface 184 and an elongate slot 190. The elongate slot 190 is formed through the top surface 180 and the bottom surface 184 and positioned adjacent to the first end 170. The first clamping member 110 is slidably coupled adjacent to the first end 170 and along the top surface 180 of the base member 160 by the retention member 150. Specifically, the retention member 150 includes a threaded protrusion 154 configured to pass through said elongate slot 190 and engage in a corresponding threaded aperture 200 formed into the first clamping member 110. In turn, the second clamping member 120 is coupled adjacent to the second end 174 of the base member 160 and along the top surface 180 of the base member 160. Such a slidable arrangement of the first and second clamping members 110, 120 provides a sleek, integrated mechanical solution for clamping the smartphone 500.

In addition, as shown in FIGS. 1 and 2, the first clamping member 110 is slidably fitted between side walls 210 protruding from the base member 160. Side walls 210 provide guidance to the sliding of the first clamping member 110 and thus contribute to the robust feel of the holding apparatus 100 of the invention.

As also shown in the figures, the first clamping member 110 can comprise protruding side walls 220 arranged perpendicularly to the base member 160, providing a side embrace of one side of the smartphone 500. Similarly, the second clamping member 120 can comprise protruding side walls 230 arranged perpendicularly to the base member 160, providing a side embrace of the other side of the smartphone 500. In the embodiment shown, in fact, both clamping members 110, 120 are provided with protruding side walls; such an arrangement contributes to securely retaining the smartphone 500. More generally speaking, having both clamping members 110, 120 comprise side walls arranged perpendicularly to the base member 160 allows the holding apparatus 100 to be capable of embracing at least three sides of a four-sided item such as the smartphone 500 shown in FIG. 3.

As shown in FIG. 1, the V-shaped grooves 130, 140 are arranged along part of the length of the side walls 220, 230 of the first and second clamping members 110, 120. Such an arrangement can allow, for instance, the remaining length of the side walls 220, 230 to be used for other purposes such as providing input/output hardware ports to/from the smartphone 500. Alternatively, the invention contemplates that the V-shaped grooves can be arranged along the entire length of the side walls of the first and second clamping members.

Figure 4:
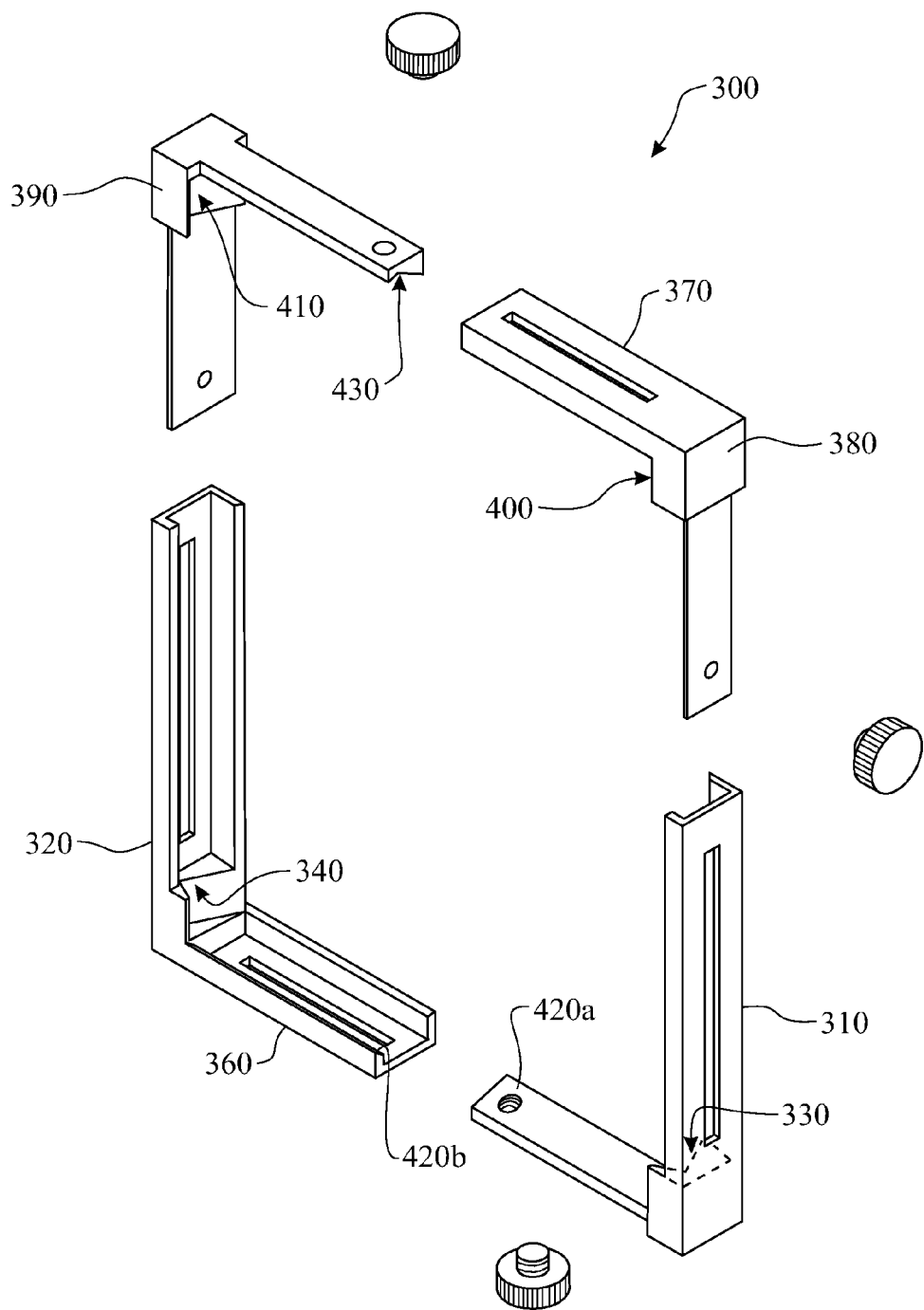
FIG. 4 presents a perspective exploded view of a second exemplary embodiment of a holding apparatus in accordance with the present invention.
Figure 5:
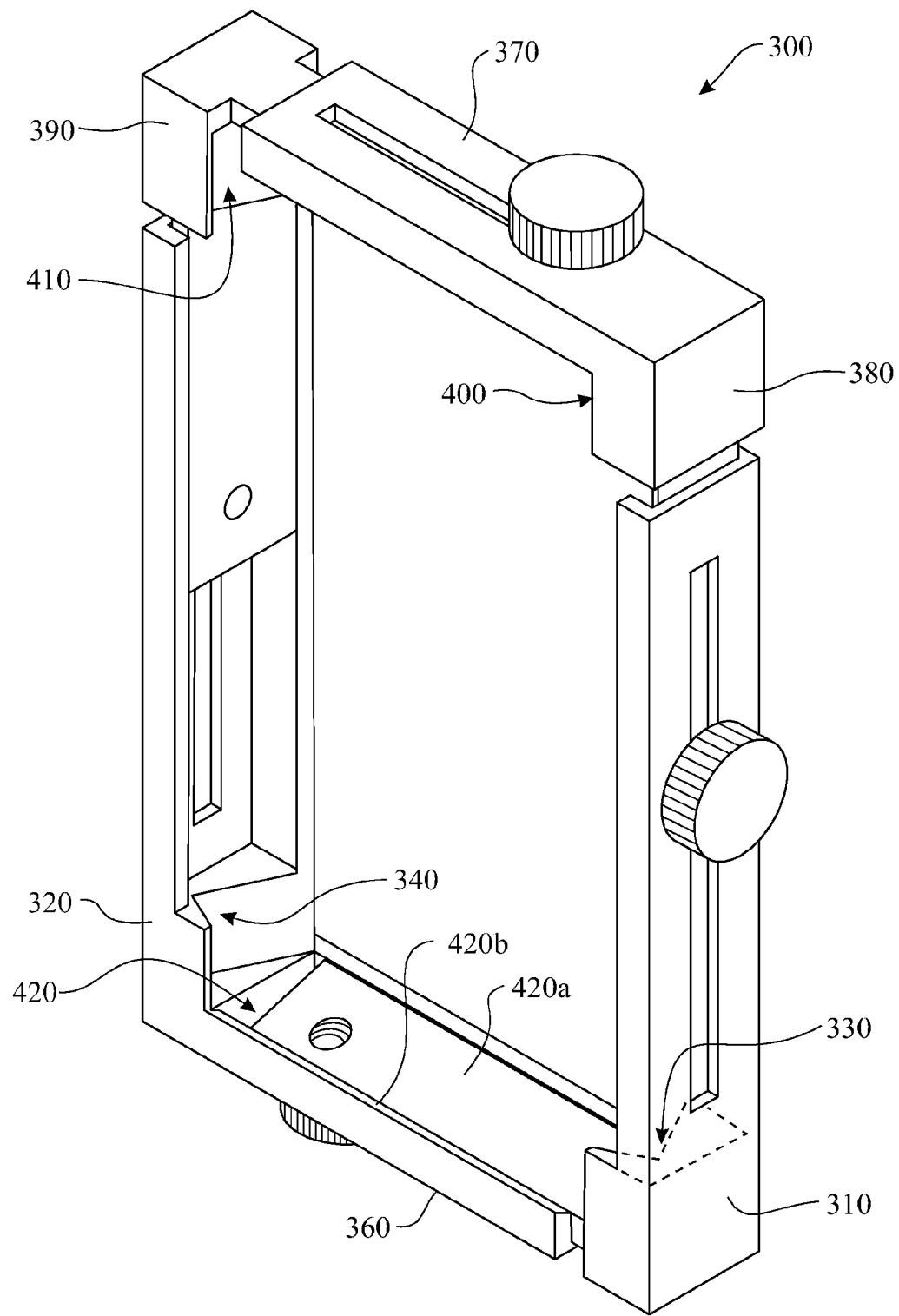
FIG. 5 presents a perspective view of the holding apparatus of FIG. 4, shown assembled.
Figure 6:
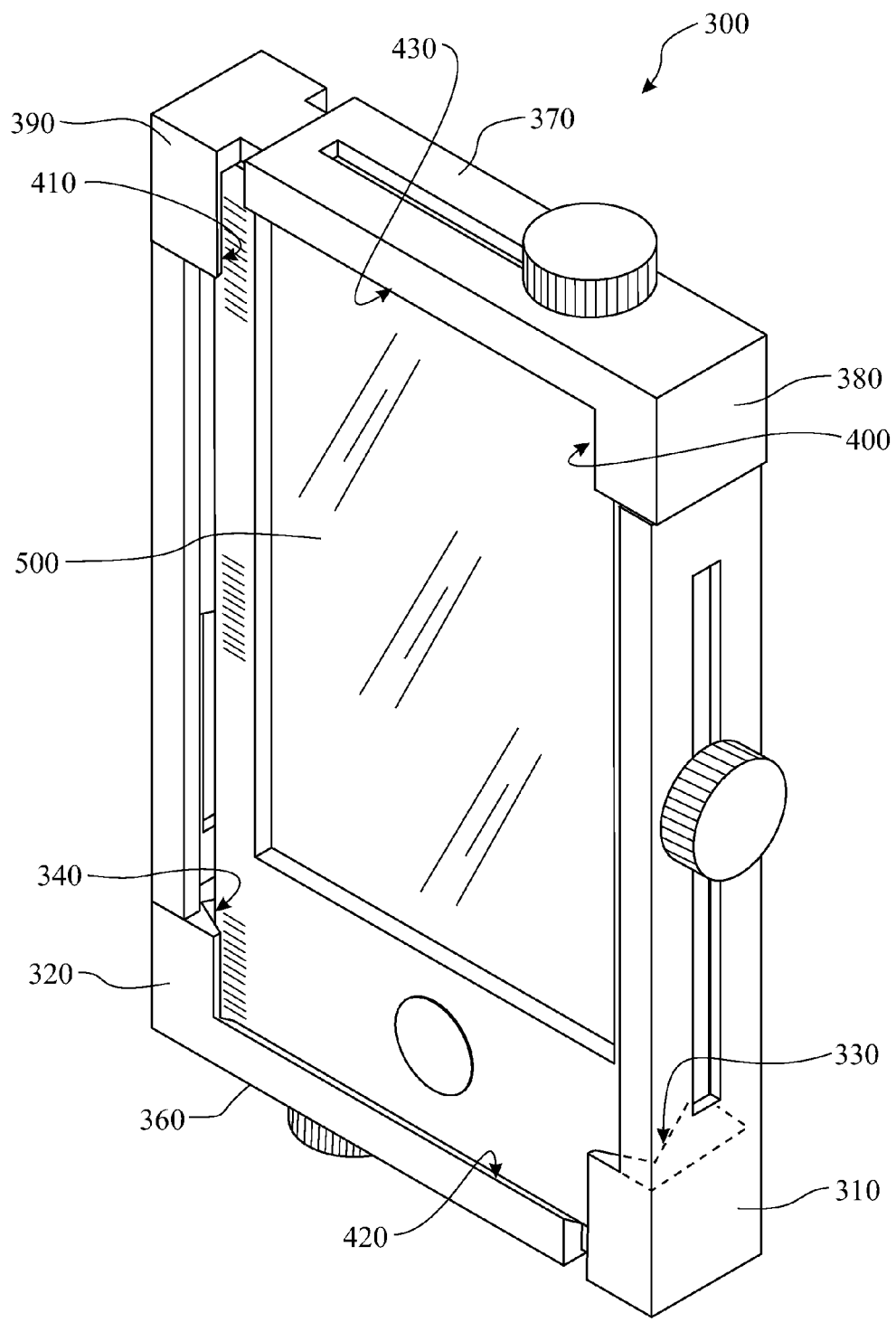
FIG. 6 presents a further perspective view of the holding apparatus of FIG. 4, shown while being used for holding a smartphone device.

The illustrations of FIGS. 4 and 5 show two perspective views of a holding apparatus according to a second embodiment of the invention. Holding apparatus 300 of the present embodiment is similar to the previous embodiment in that it also comprises a first clamping member 310 and a second clamping member 320, each provided with a respective V-shaped groove 330, 340, the second clamping member 320 being coupled to a base member 360. The present embodiment further comprises an additional base member 370 arranged in opposition to base member 360, so that the holding apparatus 300 is capable of embracing all four sides of a four-sided item. For instance, as shown in FIG. 6, in which the holding apparatus 300 is embracing a smartphone 500, the first and second clamping members 310, 320 embrace the left and right sides of the smartphone 500, while the base members 360, 370 embrace the top and bottom sides of the smartphone 500. Thus, the entire perimeter of the smartphone is gripped, further contributing to safely retain the smartphone.

In this second embodiment, the additional base member 370 is coupled to a third clamping member 380, and is slidably coupled to a fourth clamping member 390, said third and fourth clamping members 380, 390 each having a V-shaped groove 400, 410 in opposing orientation for clamping the smartphone 500 or other generally flat-shaped item. Again, the item can automatically rest on both angled surfaces of the V-shape groove 400, 410 on each clamping member 380, 390, and is thus always stably gripped by the third and fourth clamping members 380, 390. The V-shaped grooves corresponding to each side of the holding apparatus 300 may be flush or not flush. For instance, the V-shaped grooves 330, 400 of the first and third clamping members 310, 380 may be flush relative to one another, i.e. on the same plane, in order to correctly grip items having a relatively simple outer side surface as the smartphone 500 shown in the figure; alternatively, the V-shaped grooves 330, 400 of the first and third clamping members 310, 380 may not be flush or leveled, allowing for a more specific gripping of irregularly shaped items. Similarly, the V-shaped grooves 340, 410 of the second and fourth clamping members 320, 390 may be flush relative to one another, or may not be flush.

In addition, the fourth clamping member 390 is slidably coupled to the second clamping member 320, and the third clamping member 380 is slidably coupled to the first clamping member 310, thus allowing for bi-dimensional adjustment of the holding apparatus 300 onto the smartphone. A person skilled in the art will understand a bi-dimensional adjustment to be an adjustment in both a vertical direction and a horizontal direction according to the position of the holding apparatus 300 in FIGS. 4 through 6.

Preferably, as shown in the figure, the holding apparatus 300 further comprises opposing V-shaped grooves 420, 430 arranged in a transversal direction that is parallel to the base members 360, 370, so that the holding apparatus 300 is capable of clamping all four sides of a four-sided item by means of V-shaped grooves 330, 340, 400, 410, 420, 430. V-shaped clamping of all four sides of a four-sided item, such as smartphone 500 shown in FIG. 6, provides a stable three-dimensional grip in of the smartphone 500, i.e., a secure and robust grip in all three axis of the smartphone 500 (a person skilled in the art will understand that any three dimensional object is formed along three axes).

Thus, it is also an object of the present invention to define a holding apparatus for embracing a generally flat-shaped, four-sided item, said holding apparatus comprising a frame for embracing the generally flat-shaped, four sided item, said frame providing at least a first pair of opposing V-shaped clamping surfaces and a second pair of opposing V-shaped clamping surfaces, said second pair being perpendicular to the first pair so that the at least four opposing V-shaped clamping surfaces provide four-side clamping of a generally flat-shaped, four-sided item arranged inside the frame. For instance, in the embodiment shown in FIGS. 4 through 6, the frame is formed by the clamping members 310, 320, 380, 390, including the base members 360, 370 comprised in the second and third clamping members 320, 380. This frame comprises two first pairs of opposing V-shaped surfaces 330, 340; 400, 410 arranged in a first direction, i.e. a vertical direction. This frame further comprises a second pair of opposing V-shaped surfaces 420, 430 arranged in a second direction that is perpendicular to the first direction, so that the V-shaped surfaces 330, 340, 400, 410, 420, 430 provide four-side clamping of a generally flat-shaped, four-sided item arranged inside the frame, such as the smartphone 500 shown in FIG. 6. It should be noted that, due to the illustrations of FIGS. 4 through 6 being perspective views, some of the V-shaped surfaces are hidden. Specifically, the top V-shaped groove 430 and the right-side V-shaped grooves 330, 400 are hidden. However, a person skilled in the art understands their inward arrangement, so that they oppose the corresponding V-shaped grooves 420, 340, 410 at the bottom and left side of the frame. Notwithstanding, one of the hidden V-shaped grooves 330 has been schematically sketched for further understanding.

The frame of the present embodiment is quadrangular in shape and formed by four length-adjustable side portions, to provide an adjustable gripping of a four-sided electronic device or other item such as a framed picture.

Thus, as explained, the advantageous V-shaped groove clamps can be implemented on more than one axis of the apparatus. In other words, it is an object of the invention to provide a holding apparatus 100, 300 for embracing a generally flat-shaped item such as the smartphone 500 shown in FIGS. 3 and 6, where said holding apparatus 100, 300 comprising at least two opposing clamping V-shaped surfaces 130, 140; 330, 340; 400, 410; 420, 430, spaced apart for clamping at least two side areas of the item when the item is arranged in between the V-shaped surfaces. For instance, the holding apparatus 100 of FIG. 3, shown alone in FIG. 1, includes two opposing clamping V-shaped surfaces 130, 140 for gripping the sides of the item. The holding apparatus 100 of FIG. 6, shown along in FIG. 4, instead comprises six opposing clamping V-shaped surfaces 330, 340; 400, 410; 420, 430 that allow to grip the four sides of the item. It should be noted that different numbers of opposing surfaces are also contemplated by the invention. Preferably, the relative position between the V-shaped surfaces 130, 140; 330, 340; 400, 410; 420, 430 is adjustable so that the item can easily be inserted or removed from within the holding apparatus 100, 300, or to allow the holding apparatus 100, 300 to adjust to items having a different size.

The invention contemplates that the V-shaped grooves are either symmetrical or asymmetrical. A V-shaped groove is symmetrical when the angled surfaces forming the V-shape are symmetrical, i.e. have the same length and width. A V-shaped groove is asymmetrical when the angled surfaces have a different length and/or width. In other words, any specific V-shape is contemplated. For instance, the V-shaped grooves 130, 140 shown in FIG. 1 are asymmetrical. Varying the shape of the V-shaped grooves allows controlling the position of the item along the depth axis of the holding apparatus. This variation will allow improved viewing angles and accessibility of a screen and/or controls comprised in the item being held by the apparatus. Additionally, this may improve placement of the item in relation to auxiliary attachments, such as lenses or screen filters.

The invention further contemplates that the V-shaped surfaces can be integrally formed on one part or, alternatively, can be created when two parts slidably engage. For instance, the V-shaped surface 430 shown in FIG. 4 is integrally formed in the fourth clamping member 390. The V-shaped surface 420, however, is formed when an angled surface 420*a* of the first clamping member 310 and an angled surface 420*b* of the second clamping member 320 slidably align as shown in FIG. 5.

The unique V shape allows the electronic device being held to be always statically centered in the groove when the holding apparatus is engaged around the electronic device. Additionally, the V-shaped groove allows application of the device for usage in holding electronic devices of significant thickness. The groove in its configuration also causes the device being held to be self-centering, which reduces the amount of adjustment required by the user. This reduction of actions required by the user is preferred, as the intended use of this device is for holding apparatus that are frequently engaged and disengaged from the holding apparatus in typical daily usage.

While the description has been focused on application towards devices such as cameras, phones, navigation devices, media devices for video and/or audio, gaming devices, electronic devices for displaying text only, or even a second holding apparatus, the proposed design is also effective for non-electronic devices such as for holding a card or photograph.

What is claimed is:

1. A holding apparatus for retaining a generally flat-shaped item by at least partially embracing the item, said holding apparatus comprising:
   a base member having a first end, a second end, a top surface, an opposing bottom surface and an elongate slot formed through said top surface and said bottom surface and positioned adjacent said first end,
   a first clamping member and a second clamping member, movably spaced apart for clamping and unclamping a generally flat-shaped item placed in between thereof; wherein
   said first clamping member is slidably coupled adjacent to said first end and along said top surface of said base member by a retention member, said retention member having a threaded protrusion configured to pass through said elongate slot and engage in a corresponding threaded aperture formed into said first clamping member, and said second clamping member is coupled adjacent to said second end of said base member and along said top surface of said base member; and wherein said first and second clamping members include respective V-shaped grooves in opposing orientation for clamping the item, so that the item automatically rests on both angled surfaces of the V-shaped groove on each clamping member, and is thus always stably gripped by the clamping members, said holding apparatus further including an additional base member arranged in opposition to the base member, so that the holding apparatus is capable of embracing all four sides of a four-sided item.

2. The holding apparatus of claim 1, wherein said retention member fixes the relative position of the first and second clamping members.

3. The holding apparatus of claim 1, wherein the first clamping member is slidably fitted between side walls protruding from the base member.

4. The holding apparatus of claim 1, wherein the first clamping member comprises protruding side walls arranged perpendicularly to the base member.

5. The holding apparatus of claim 1, wherein the second clamping member comprises protruding side walls arranged perpendicularly to the base member.

6. The holding apparatus of claim 1, wherein the first and second clamping members comprise side walls arranged perpendicularly to the base member.

7. The holding apparatus of claim 6, wherein the V-shaped grooves are arranged along part of the length of the side walls of the first and second clamping members.

8. The holding apparatus of claim 6, wherein the V-shaped grooves are arranged along the entire length of the side walls of the first and second clamping members.

9. The holding apparatus of claim 1, wherein the additional base member is coupled to a third clamping member, and is slidably coupled to a fourth clamping member, said third and fourth clamping members having a V-shaped groove in opposing orientation for clamping the generally flat-shaped item, so that the item automatically rests on both angled surfaces of the V-shape groove on each clamping member, and is thus always stably gripped by the third and fourth clamping members.

10. The holding apparatus of claim 9, wherein the fourth clamping member is slidably coupled to the second clamping member, and the third clamping member is slidably coupled to the first clamping member, thus allowing for bi-dimensional adjustment of the holding apparatus onto the item.

11. The holding apparatus of claim 1, further comprising opposing V-shaped grooves parallel to the base members, so that the holding apparatus is capable of clamping all four sides of a four-sided item by means of V-shaped grooves.

12. A holding apparatus for retaining a generally flat-shaped, four-sided item by at least partially embracing the item, said holding apparatus comprising:

a frame for embracing a generally flat-shaped, four sided item, said frame providing at least a first pair of opposing V-shaped clamping surfaces and a second pair of opposing V-shaped clamping surfaces, said second pair being perpendicular to the first pair so that said at least four opposing V-shaped clamping surfaces provide four-side clamping of a generally flat-shaped, four-sided item arranged inside the frame.

13. The holding apparatus of claim 12, wherein the distance between opposing V-shaped clamping surfaces of at least one pair of V-shaped clamping surfaces is adjustable.

14. The holding apparatus of claim 12, wherein the frame is quadrangular in shape and formed by four length-adjustable side portions.

* * * * *